(12) United States Patent
Nemoto et al.

(10) Patent No.: US 6,705,819 B1
(45) Date of Patent: Mar. 16, 2004

(54) FEEDER FOR CHIP COMPONENTS

(75) Inventors: Akira Nemoto, Shiga-ken (JP); Shigeki Takahashi, Shiga-ken (JP); Nihei Kaishita, Shiga-ken (JP); Mitsuhiro Namura, Shiga-ken (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/678,096

(22) Filed: Oct. 4, 2000

(30) Foreign Application Priority Data

Oct. 18, 1999 (JP) ............................................ 11-294942
Sep. 4, 2000 (JP) .......................................... 2000-266634

(51) Int. Cl.⁷ ..................... B65B 21/02; B65B 69/00; B65G 65/04; B65G 65/34; B65G 59/04
(52) U.S. Cl. ..................... 414/416; 221/224; 221/236; 221/312 R
(58) Field of Search .......................... 414/416, 414; 221/211, 212, 224, 236, 197, 312 R; 198/679, 690.1

(56) References Cited

U.S. PATENT DOCUMENTS

| | | | | | |
|---|---|---|---|---|---|
| 4,307,832 A | * | 12/1981 | Taki et al. | ............... | 221/236 X |
| 5,582,493 A | * | 12/1996 | Hineno et al. | ............... | 406/137 |
| 5,730,317 A | * | 3/1998 | Mitsushima et al. | ..... | 221/131 X |
| 5,934,505 A | * | 8/1999 | Shimada | ................. | 221/236 X |
| 6,041,964 A | * | 3/2000 | Tokarz et al. | ............ | 221/211 X |
| 6,073,800 A | * | 6/2000 | Saito et al. | .............. | 221/212 X |
| 6,290,095 B1 | * | 9/2000 | Saito et al. | .............. | 221/236 X |
| 6,199,738 B1 | | 3/2001 | Kondo et al. | | |
| 6,296,104 B1 | * | 10/2001 | Ito et al. | ............... | 198/468.5 X |

FOREIGN PATENT DOCUMENTS

| | | |
|---|---|---|
| EP | 0 601 603 A1 | 6/1994 |
| JP | 5-167287 | 7/1993 |
| JP | 09-107196 | 4/1997 |
| JP | 11-238999 | 8/1999 |

* cited by examiner

*Primary Examiner*—Christopher P. Ellis
*Assistant Examiner*—Gene O. Crawford
(74) *Attorney, Agent, or Firm*—Burns, Doane, Swecker & Mathis, LLP (57) ABSTRACT

A feeder for chip components is provided wherein the chip components can be supplied with high stability even in high-speed operation by operating a conveying member at a lower speed than that of a chip mounter and operating the conveying member even when the chip mounter is stopped. The chip components on a belt are supplied in one direction by lowering a feed lever according to the input load from a chip mounter so as to drive the belt connected to the feed lever via a transmission mechanism intermittently in one direction. urging means is provided for urging the feed lever in the returning direction by storing the input load of the chip mounter as energy while an eddy current damper is provided for delaying the returning operation of the feed lever relative to the returning operation of the chip mounter. When the chip mounter operates downwardly, the feed lever is moved downwardly by linking to the chip mounter while the conveyor belt is maintained in a stationary state. When the chip mounter operates upwardly, the feed lever is moved upwardly so as to be delayed relative to the chip mounter by the eddy current damper while the belt is driven at a low speed.

13 Claims, 12 Drawing Sheets

DISPLACEMENT OF MOUNTER LEVER

Fig.16B

DISPLACEMENT OF BLADE WITHOUT DELAY MECHANISM

Fig.16C

DISPLACEMENT OF BLADE WITH DELAY MECHANISM

FEEDER FOR CHIP COMPONENTS

BACKGROUND OF THE INVENTION

1. Field of the Invention

The present invention relates to feeders for chip components, and in particular relates to a feeder for intermittently feeding chip components in one direction by using the driving force of a chip mounter.

2. Description of the Related Art

Hitherto, a feeder for chip components is known, wherein chip components accommodated in a hopper are dropped one at a time from a discharge hole on the bottom of the hopper onto an endless belt by a vertically moving pipe linked to the operation of a chip mounter while the chip components conveyed to an end portion of the endless belt by intermittently driving the endless belt forwardly by a belt driving mechanism are picked up one by one by the chip mounter (see Japanese Unexamined Patent Application Publication No. 8-48419, for example).

In the above-mentioned feeder, the pipe for dropping chip components in the hopper from the discharge hole is vertically driven by a driving lever pushed down by the chip mounter and the belt driving mechanism drives a belt driving pulley intermittently via a ratchet claw by a driving lever swung by retracting means moving simultaneously with the chip mounter. Since by utilizing the input load of the chip mounter, the chip components are taken out from the hopper onto the belt and the chip components are intermittently conveyed by the belt, the feeder has an advantage that a specific driving source is not required and synchronization between the feeder and the chip mounter can be readily obtained.

Recently, high feeding capacity is required for a feeder of the type and feeders having a capacity of 0.1 s per one chip component or less-have been put to practical use. When chip components are fed in such a short time, jumping and slippage of the chip components occur on the belt, so that a problem that the chip components cannot be fed in a stable state arises. The reasons thereof will be described with reference to FIGS. 1A to 1C.

Figure 1A:
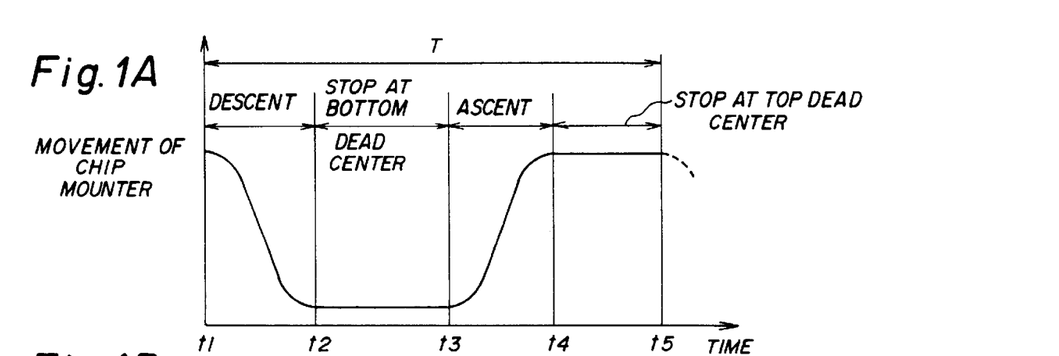
FIGS. 1A to 1C are time charts for comparing operation of a conventional feeder with that of a feeder according to the present invention.
Figure 1B:
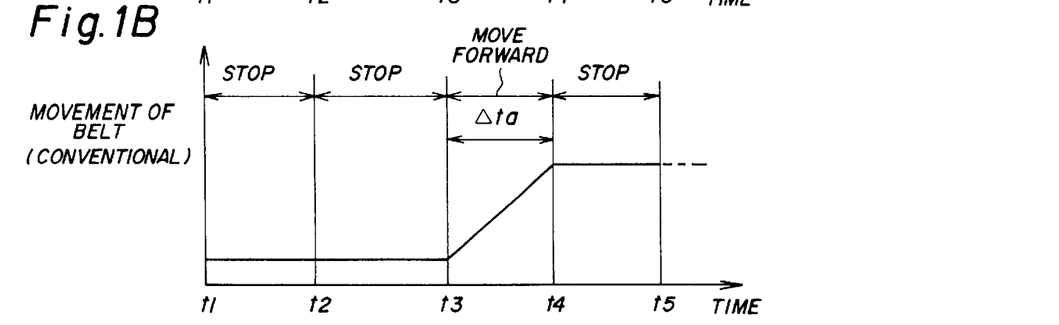

FIGS. 1A and 1B show an example of operations of the chip mounter and the belt for driving the feeder.

As shown in FIG. 1A, the chip mounter starts to descend at the time $t_1$ and reaches the bottom dead center at the time $t_2$. From the time $t_2$ through the time $t_3$, the chip mounter is stopped while the forefront chip component conveyed on the belt is sucked up. At the time $t_3$, the chip mounter starts to ascend and reaches the top dead center at the time $t_4$. From the time $t_4$ through the time $t_5$, a suction nozzle is moved and orientation of the chip component is recognized, so that the sucked chip component is mounted on a circuit board, etc.

On the other hand, as shown in FIG. 1B, since the belt is driven in synchronization with the ascent of the chip mounter, the belt is forwardly driven only during the ascent of the chip mounter $\Delta t_a$ ($t_3$ to $t_4$) and is stopping for the rest of the time.

In such a high-speed operation having a tact time of 0.1 s as described above, the belt driving time $\Delta t_a$ is to be smaller in proportion to the tact time. Therefore, the belt has to be driven at a high-speed, so that the frictional force between the chip component and the belt is not effectively exerted, and the chip components cannot be thereby fed in a stable state due to jumping and slippage of the chip components on the belt.

SUMMARY OF THE INVENTION

Accordingly, it is an object of the present invention to provide a feeder for chip components capable of feeding chip components in a stable state even in the high-speed operation by driving a conveying section at a lower speed than that of the chip mounter and even when the chip mounter is stopped.

In order to achieve the above-mentioned object, in accordance with a first aspect of the present invention, there is provided a feeder for chip components, including a feed lever operated according to the input load from a chip mounter and a conveyor belt connected to the feed lever via a one-way feeding mechanism, the feeder feeding chip components on the conveyor belt in one direction by intermittently driving the conveyor belt in one direction, the feeder for chip components comprising: an urging means for urging the feed lever in the returning direction by storing the input load of the chip mounter in the operating direction as energy; and a delay mechanism for delaying the returning operation of the feed lever relative to the operation of the chip mounter in the returning direction, wherein when the chip mounter operates in the operating direction, the feed lever is moved in the operating direction by linking to the chip mounter while the conveyor belt is maintained in a stationary state by the one-way feeding mechanism, and wherein when the chip mounter operates in the returning direction, the feed lever is moved in the returning direction so as to be delayed relative to the chip mounter by the urging means and the delay mechanism while the conveyor belt is driven via the one-way feeding mechanism.

The feeder for chip components according to the first aspect of the present invention will be described with reference to FIG. 1C.

In the feeder, when the chip mounter operates ($t_1$ to $t_2$), the belt is stopped, and when the chip mounter is retracted ($t_3$ to $t_4$), the belt is driven; however, the belt is out of synchronization with the retraction of the chip mounter due to a delay mechanism and continues to be driven at a low speed even after the chip mounter reaches the top dead center. Therefore, the belt driving time $\Delta t_b$ ($t_3$ to $t_6$) can be prolonged compared with the conventional driving time $\Delta t_a$ ($t_3$ to $t_4$), so that the belt can be driven at a lower speed for the same feeding amount. Thereby, the frictional force between the belt and the chip components are effectively exerted and the chip components can be supplied with high stability even in high-speed operation.

In particular, in the feeder, the belt is not driven by the input load of the chip mounter but when the chip mounter is retracted, driven by the energy stored in the urging means. Therefore, the belt can be driven at a low speed without being restricted by the operation of the chip mounter.

The belt drive termination time $t_6$ may be any time as long as it is before the next ascent starting time $t_5$ of the chip mounter, so that the belt driving time can be secured as long as possible within the time range of $t_3$ to $t_5$. The operating speed of the belt is adjustable by the delay mechanism.

As a delay mechanism, a known delay mechanism such as an eddy current damper, a damper utilizing viscosity of a fluid, and an air damper can be employed. The set-up place for the delay mechanism is not limited to the feed lever portion; it may be arranged around the one-way feeding mechanism or a driving unit for the belt.

As operating characteristics of the delay mechanism, the resistance force may be exerted in both operating and returning directions of the feed lever, or it may be exerted only in the returning direction while it is not exerted in operating direction.

As the urging means, means for storing elastic energy such as a spring and means for storing potential energy such as a weight may be used.

In a second aspect of the present invention, a reciprocating conveying member is used instead of the belt in the first aspect. That is, in accordance with the second aspect, there is provided a feeder for chip components, including a feed lever operated according to the input load from a chip mounter and a conveying member connected to the feed lever via a transmission mechanism, the feeder feeding chip components on the conveying member in one direction by reciprocating the conveying member using a frictional force, the feeder for chip components comprising: an urging means for urging the feed lever in the returning direction by storing the input load of the chip mounter in the operating direction as energy; and a delay mechanism for delaying the returning operation of the feed lever relative to the operation of the chip mounter in the returning direction, wherein when the chip mounter operates in the operating direction, the feed lever is moved in the operating direction by linking to the chip mounter while the chip components are slid relative to the conveying member by retracting the conveying member at high speed via the transmission mechanism, and wherein when the chip mounter operates in the returning direction, the feed lever is moved in the returning direction so as to be delayed relative to the chip mounter by the delay mechanism while the chip components are unitarily conveyed with the conveying member by forwardly driving the conveying member at low speed via the transmission mechanism.

When the chip mounter operates in the operating direction, and accordingly, the feed lever is moved, the conveying member is retracted via a transmission mechanism in a high speed. Thereby, the frictional force is scarcely exerted to the chip components on the conveying member so that only the conveying member is retracted while the chip components maintain their positions. Next, when the chip mounter operates in the returning direction, the feed lever is retracted behind the chip mounter due to the delay mechanism. Therefore, the conveying member connected thereto via the transmission mechanism also proceeds at a low speed behind the chip mounter. Accordingly, the frictional force is exerted to the chip components on the conveying member, so that the chip components also proceed unitarily with the conveying member.

Due to the delay mechanism, the proceeding time of the conveying member can be prolonged until the time just before the next operation starting time of the chip mounter, so that the driving time of the conveying member can be secured as long as possible. Therefore, the conveying member can be driven forwardly at a low speed, so that the chip components can be supplied with high stability even in high-speed operation.

Preferably, the transmission mechanism comprises a cam intermittently rotating in one direction according to the movement of the feed lever and a spring for making the conveying member contact with and to track the surface of the cam. With these features, when the chip mounter operates in the operating direction, the cam is rotated via the feed lever, so that the conveying member is dropped into the valley portion of the cam from the peak portion thereof. Thereby, the conveying member is retracted at a high speed. When the chip mounter operates in the returning direction, the conveying member rides onto the peak portion from the valley portion of the cam, and thereby the conveying member proceeds at a low speed. The proceeding speed of the conveying member is reduced by functions of the cam profile and the delay mechanism, so that the frictional force between the conveying member and the chip components is sufficiently exerted, resulting in supplying the chip components without slippage.

Preferably, the transmission mechanism comprises a bell crank wherein the feed lever and the conveying member are rotatably connected to arm portions projectingly formed on both sides of a swinging shaft. With these features, when the feed lever and the conveying member are connected together via the bell crank, the feed lever and the conveying member are operated in synchronization with each other. At this time, the conveying member can be retracted at a high speed and moved forwardly at a low speed by operating the feed lever at a high speed in the operating direction and at a low speed in the returning direction due to the delay mechanism.

Preferably, the delay mechanism is an eddy current damper. In the eddy current damper, as is generally known, a conductive member is arranged so as to oppose magnetic flux generating means (a magnet, for example) and one of the magnetic flux generating means and the conductive member is movable relative to the other in the direction orthogonal to the opposing direction. Since an eddy current induced in the conductive member is generated in the direction that prevents changes in magnetic flux, a resistance force is exerted to the movable member by the eddy current and with increasing displacing speed of the movable member, the lager resistance force is exerted. That is, the load proportional to the speed is obtained from the eddy current damper, so that the acceleration is stopped at the speed determined by the relation with the spring force. Therefore, in high-speed operation, conveying can be securely achieved. For example, when the eddy current damper is arranged between the feed lever and a fixed portion, if the feed lever moves in any direction, the resistance force is exerted to the feed lever so as to prevent the movement in the direction. Since the driving force for the feed lever in the operating direction is given by the chip mounter, even when the resistance force is exerted, the feed lever is unitarily moved with the chip mounter without being prevented by the resistance force. In contrast, since the driving force for the feed lever in the returning direction is given by the urging means, the urging force by the urging means is restrained by the eddy current damper, so that the feed lever can be returned at a low speed. Since the eddy current damper has not sliding portions, it has an advantage that characteristics do not change even when using for a long period.

Preferably, the delay mechanism is a hysteresis brake. The hysteresis brake comprises composite magnetic poles having the N pole of the magnet and the S pole alternately arrayed and a magnetic material arranged so as to oppose the composite magnetic poles and being relatively movable in the direction orthogonal to the opposing direction, and generates a brake force utilizing the hysteresis loss of the magnetic material. Different from the eddy current damper, the brake force of the hysteresis brake is not dependent on the speed and the hysteresis brake has an advantage that the brake force can be readily obtained even in low-speed operation. When the hysteresis brake is arranged between the feed lever and a fixed portion, for example, the sufficient brake force can be obtained even in low-speed operation of the feed lever, and delay operation can be securely performed. In addition, since the hysteresis brake also has not sliding portions, characteristics thereof do not change even when using for a long period.

Preferably, the hysteresis brake adds a function as an eddy current damper by forming the entirety of or part of the magnetic material forming the hysteresis brake from a conductive material. The hysteresis brake is not dependent on the speed as described above, and when it is used as a simple substance, the feed lever continues acceleration, so that the speed control and the restriction of generation of a shock and a noise at the top dead center may be difficult. Therefore, by adding a function as an eddy current damper to the hysteresis brake, the chip components can be supplied with high stability for all the operations from the low-speed to the high-speed.

DESCRIPTION OF THE PREFERRED EMBODIMENTS

FIGS. 2 to 6 show a first embodiment of a feeder for chip components according to the present invention. In addition, in this embodiment, a square chip electronic component having electrodes at both ends is used as a chip component P.

Figure 2:
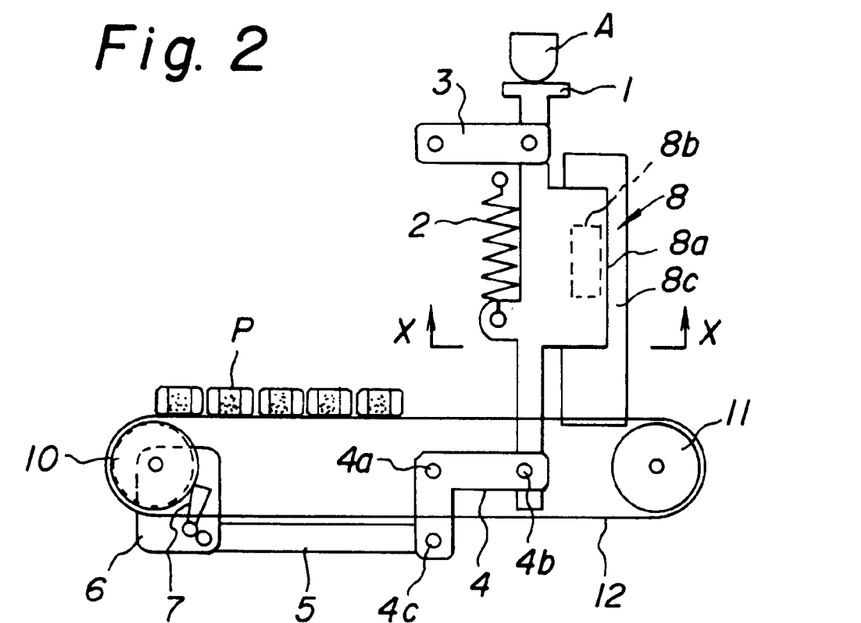
FIG. 2 is a side view of a feeder according to a first embodiment of the present invention.

The feeder comprises a feed lever 1 and a spring 2 for urging the feed lever 1 so as to return upwardly. The feed lever 1 is supported by a feeder body movably in the vertical direction via a link 3 and a bell crank 4. On the top of the feed lever 1, a mounter lever A of the chip mounter is arranged. The mounter lever A moves vertically in a range of a predetermined stroke by linking to the operation of the chip mounter. Therefore, the feed lever 1 is pushed down by the mounter lever A.

The lower end portion of the feed lever 1 is connected to a link 5 via the bell crank 4 and is furthermore connected to a swing plate 6 coaxially attached with a driving pulley 10. The bell crank 4 is swingablly arranged in the feeder body using a shaft 4a as a supporting point. Ends of two arm portions of the bell crank 4 are connected to the lower end portion of the feed lever 1 and the link 5 via pins 4b and 4c, respectively. A feed claw 7 for engaging with the driving pulley 10 is attached to the swing plate 6 so as to rotate the driving pulley 10 in only one direction by swinging of the swing plate 6.

An endless conveyor belt 12 is horizontally wound around between the driving pulley 10 and a driven pulley 11. On the belt 12, plural chip components P are placed in a linear arrangement. By the up-and-down movement of the feed lever 1, the driving pulley 10 is rotated only counterclockwise via the feed claw 7, so that the chip components P can intermittently proceed by one increment at a time.

Figure 3:
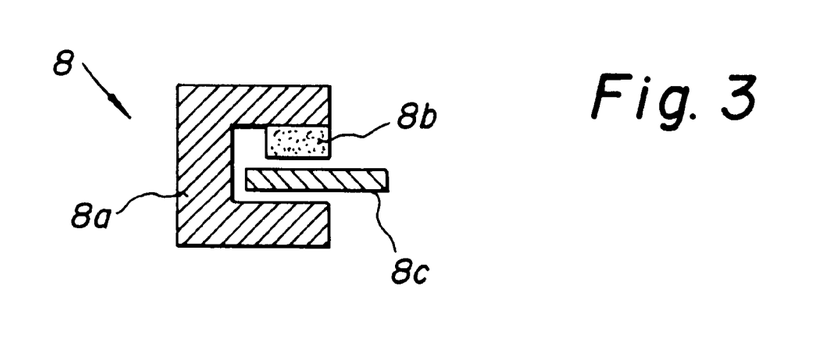
FIG. 3 is a cross-sectional view at the line X—X of FIG. 2.

In the side of the feed lever 1, an eddy current damper 8, which is an example of a delay mechanism, is provided. The eddy current damper 8 comprises a yoke 8a arranged in the feed lever 1 and having a ⊂-shaped cross-section, a magnet 8b attached to the yoke 8a, and a residual conductor plate 8c which is fixed to the feeder body and movable in the opening of the yoke 8a. A magnetic field generated in the yoke 8a acts in the direction orthogonal to the conductor plate 8c. In the embodiment, the yoke 8a is arranged in the feed lever 1 and the residual conductor plate 8c is fixed to the feeder body; however, the yoke 8a may be arranged in the feeder body and the residual conductor plate 8c may be fixed to the feed lever 1.

Also, the cross-section of the yoke 8a is not necessarily ⊂-shaped, it may be square (a planar plate).

Due to the function of the eddy current damper 8, when the feed lever 1 (yoke 8a) is to move downwardly, the resistance force against the downward movement acts on the feed lever 1, in contrast, when it is to move upwardly, the resistance force against the upward movement acts thereon. Since the driving force to move the feed lever 1 downwardly is caused by the mounter lever A, even when the resistance force of the eddy current damper 8 acts thereon, the feed lever 1 is moved downwardly together with the mounter lever A without being prevented by the resistance force. However, since the driving force to move the feed lever 1 upwardly is caused by the spring 2, the urging force of the spring 2 is suppressed by the eddy current damper 8, so that the feed lever 1 ascends at a low speed.

Next, the operation of the feeder will be described with reference to FIGS. 2, 4, 5, and 6.

FIG. 2 shows the state that the mounter lever A is at the top dead center, and the feed lever 1 also stops at the position being in contact with the mounter lever A.

Figure 4:
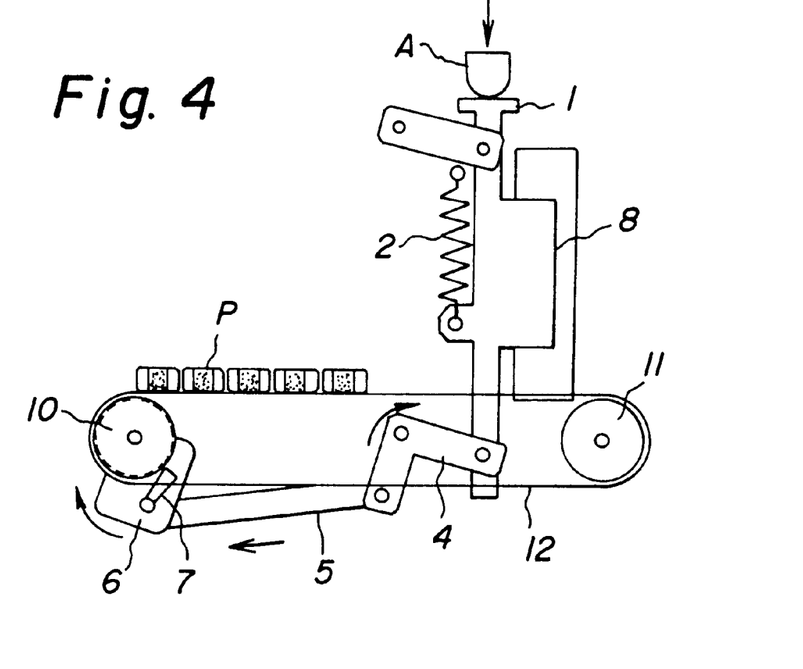
FIG. 4 is a side view of the feeder shown in FIG. 2 when it is descending.

When the mounter lever A descends from the state of FIG. 2, the feed lever 1 also descends in synchronization with the mounter lever A (see FIG. 4). At this time, the spring 2 is deformed under tension and stores the input energy of the mounter lever A as elastic energy. Simultaneously, the feed claw 7 is raced clockwise around the driving pulley 10 by the bell crank 4, the link 5, and the swing plate 6. Therefore, the conveyor belt 12 is static.

Figure 5:
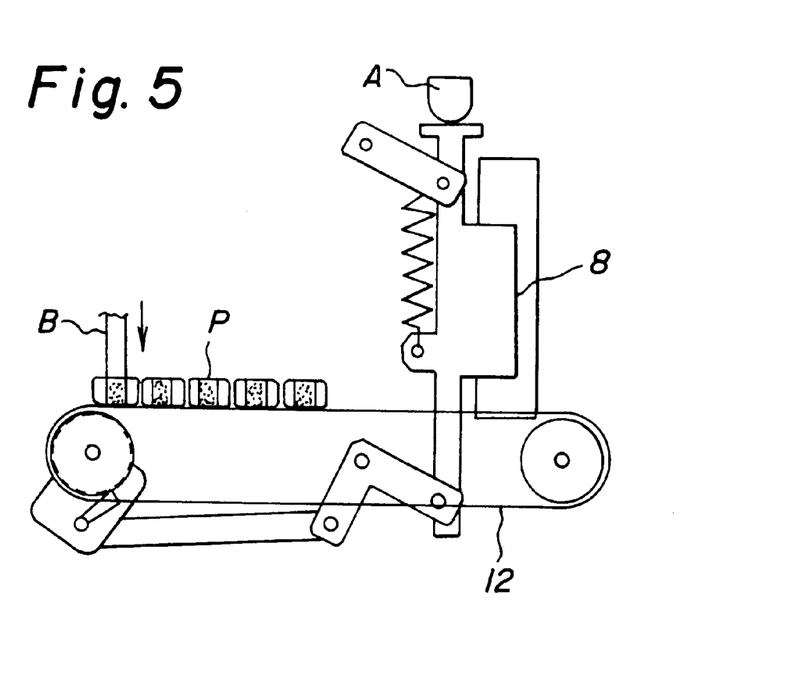
FIG. 5 is a side view of the feeder shown in FIG. 2 when it is at the bottom dead center.
Figure 6:
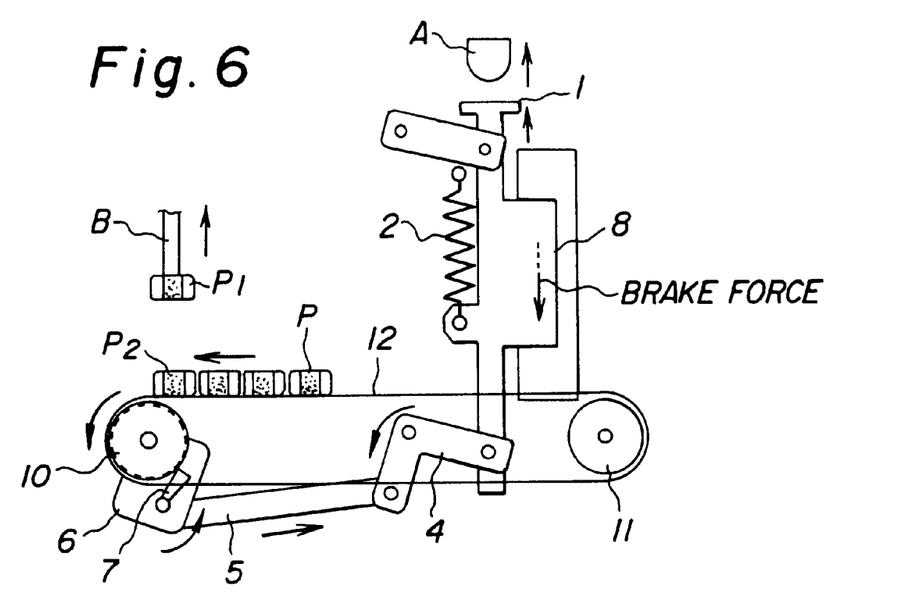
FIG. 6 is a side view of the feeder shown in FIG. 2 when it is ascending.

FIG. 5 shows the state that the mounter lever A stops at the bottom dead center. In this state, a suction nozzle B provided in the mounter sucks the forefront component $P_1$ on the belt 12. When the mounter lever A starts to ascend, as shown in FIG. 6, after the suction nozzle B lifts the forefront component $P_1$, the feed lever 1 ascends by the elastic energy stored in the spring 2. When the feed lever 1 ascends, the driving pulley 10 is driven counterclockwise by the feed claw 7, so that the conveyor belt 12 is fed forward by one increment. Thereby, the chip components P on the belt 12 are also fed by one increment so that the second chip component $P_2$ reaches the suction position.

When the feed lever 1 ascends, due to the function of the eddy current damper 8, a braking force acts thereon, as shown by the arrow drawn by a broken line, and thereby the ascending speed of the feed lever 1 and the feeding speed of the conveyor belt 12 are restrained to be low while gradually releasing the elastic energy stored in the spring 2. Therefore, even when the mounter lever A reaches the top dead center, the feed lever 1 continues ascending. That is, even when the load from the chip mounter stopping at the top dead center is not input, the feed lever 1 continues the operation, so that the belt 12 connected thereto also continues the feeding operation.

Figure 1C:
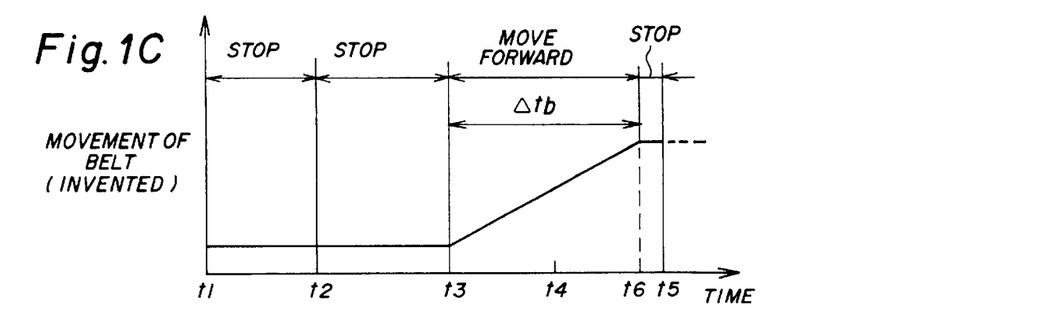

The operation of the conveyor belt 12 accompanied by the operation of the mounter lever A is as shown in FIG. 1C. Since the driving time $\Delta t_b$ of the conveyor belt 12 can be prolonged due to the function of the delay mechanism (eddy current damper 8), the belt 12 can be driven at a lower speed for the same feeding amount, and thereby the chip components P on the belt 12 can be fed in a stable state without jumping and slippage.

In addition, in the embodiment, the spring 2 is deformed so as to store energy-during the descending of the feed lever 1 and the stored energy is released during the ascending; however, the operation may be performed in the opposite.

As for the spring 2, it is not limited to an extension spring; it may be a compression spring, and furthermore may be a leaf spring or a torsion spring instead of the coil spring. Accordingly, the fixing position of the spring 2 is not limited to the side of the feed lever 1; it may be the shaft portions of the bell crank 4 or the swing plate 6.

FIGS. 7 to 10 show a feeder for chip components according to a second embodiment of the present invention. In this embodiment, a blade reciprocating back and forth is used as a conveying member instead of the belt in the first embodiment.

In addition, like reference characters designate like portions having functions common to those in FIG. 2, and description thereof is omitted.

Figure 7:
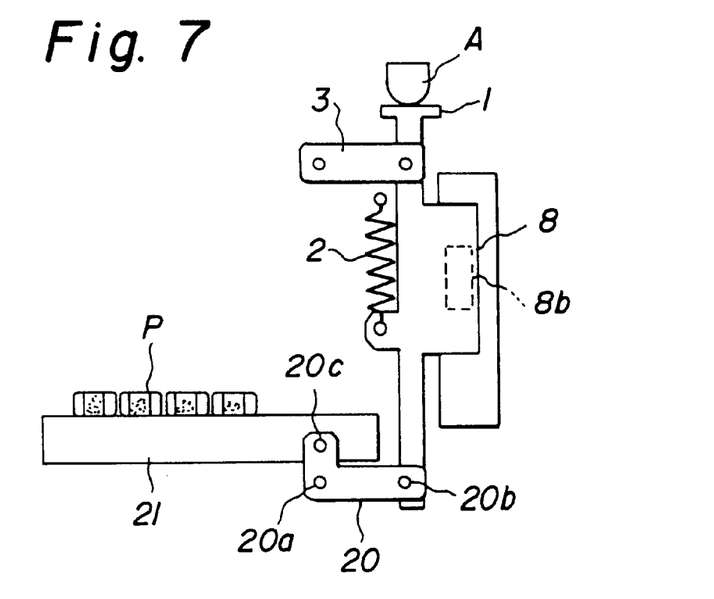
FIG. 7 is a side view of a feeder according to a second embodiment of the present invention.

The lower end portion of the feed lever 1 is connected to a blade 21 via a bell crank 20. The bell crank 20 is swingablly arranged in the feeder body using a shaft 20a as a supporting point. Ends of two arm portions of the bell crank 20 are connected to the lower end portion of the feed lever 1 and the blade 21 via pins 20b and 20c, respectively. Therefore, the vertical movement of the feed lever 1 is converted to the back-and-forth-reciprocating movement of the blade 21. The blade 21 is movably guided in the horizontal direction and the chip components P are placed thereon in a linear arrangement. In addition, although not shown in the drawing, the blade 21 forms the bottom part of a guide groove for aligning the chip components P in a line.

The operation of the feeder according to the above-mentioned embodiment will be described with reference to FIGS. 7 to 10.

FIG. 7 shows the state that the mounter lever A is at the top dead center, and the feed lever 1 is also at the position of contact with the mounter lever A. Since the feed lever 1 is at the top end position, the blade 21 connected thereto via the bell crank 20 is at the front-end position.

Figure 8:
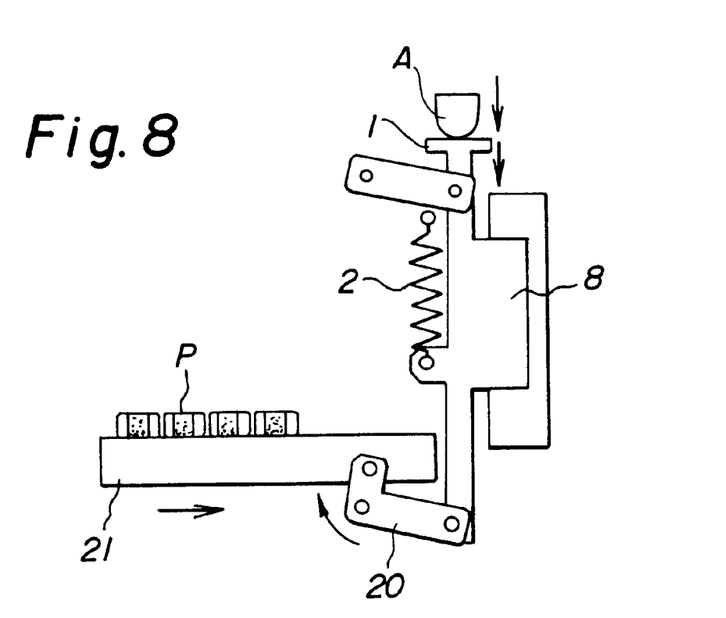
FIG. 8 is a side view of the feeder shown in FIG. 7 when it is descending.

FIG. 8 shows the state that the mounter lever A starts to descend, and the feed lever 1 also descends in synchronization with the mounter lever A. At this time, the spring 2 is deformed under tension and stores the input energy of the mounter lever A as elastic energy. Simultaneously, the blade 21 is retracted at high speed via the bell crank 20 and slippage between the blade 21 and the chip components P occurs, so that only the blade 21 is retracted while the chip components P maintain their positions.

Figure 9:
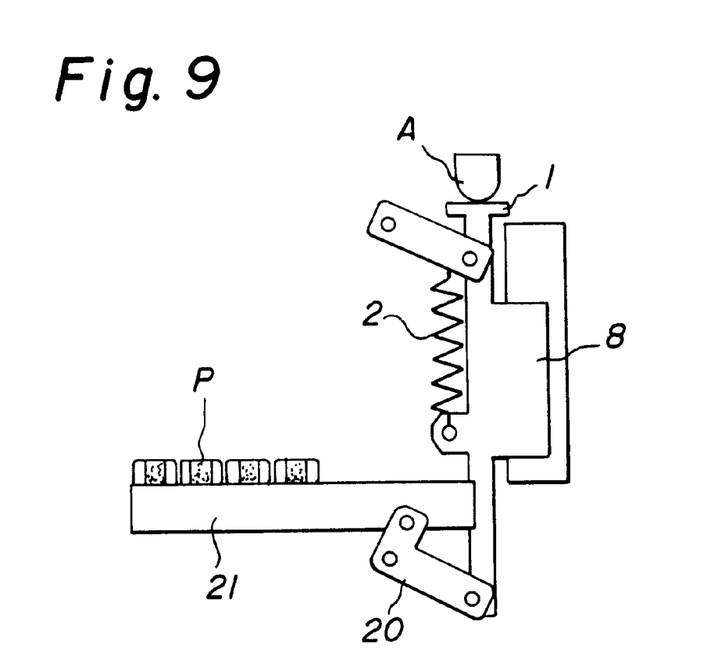
FIG. 9 is a side view of the feeder shown in FIG. 7 when it is at the bottom dead center.

FIG. 9 shows the state that the mounter lever A stops at the bottom dead center. At this time, the chip components P are placed in the vicinity of the front-end position of the blade 21.

Figure 10:
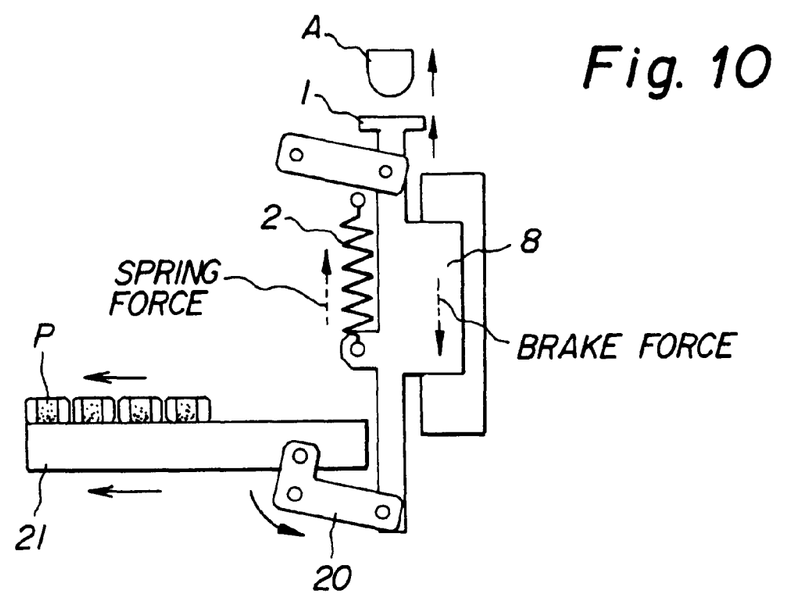
FIG. 10 is a side view of the feeder shown in FIG. 7 when it is ascending.

When the mounter lever A starts to ascend from the bottom dead center, as shown in FIG. 10, the feed lever 1 ascends by the elastic energy (spring force) stored in the spring 2. When the feed lever 1 ascends, the blade 21 proceeds forwardly via the bell crank 20. At this time, due to the function of the delay mechanism (eddy current damper 8), the ascending speed of the feed lever 1 is restrained to be low, so that the proceeding speed of the blade 21 is also restrained to be low. That is, due to the frictional force of the blade 21, the entire chip components P are forwardly moved by one increment by the forward proceeding of the blade 21 at a low speed. When the chip components P are moved to the front-end position, the forefront component may be sucked by a suction nozzle (not shown).

Figure 11A:
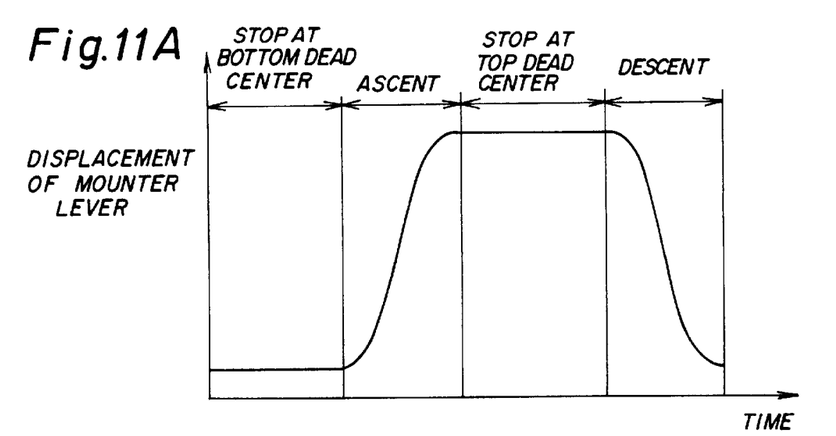
FIGS. 11A to 11C are time charts for comparing operation of a feeder without a delay mechanism with that of a feeder having a delay mechanism shown in FIG. 7.
Figure 11B:
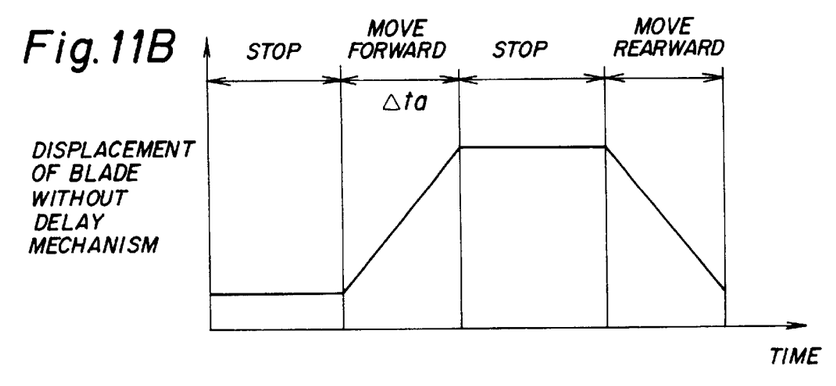
Figure 11C:
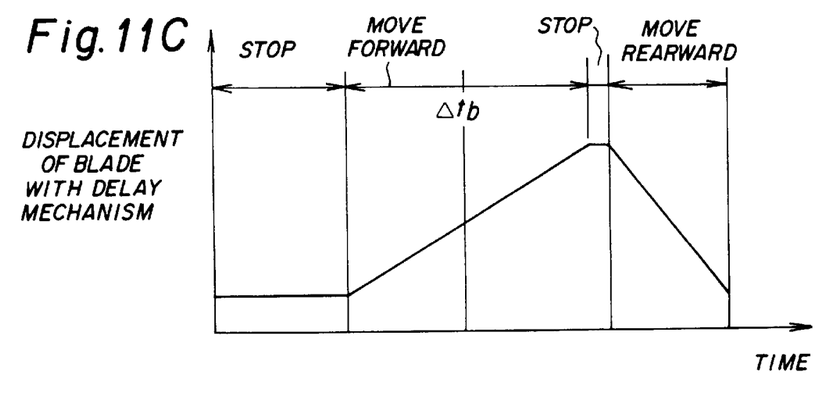

FIGS. 11A to 11C show operations of the mounter lever A and the blade 21 of the feeder shown in FIG. 7. In addition, FIG. 11B shows the operation of the blade 21 without the delay mechanism (eddy current damper 8).

When the blade 21 has not the. delay mechanism, as shown in FIG. 11B, since the blade 21 proceeds in synchronization with the ascending of the mounter lever A, the proceeding time $\Delta t_a$ of the blade 21 is small, so that slippage between the blade 21 and the chip components P may occur. In contrast, when the delay mechanism 8 is provided therein, as shown in FIG. 11C, since the blade 21 proceeds out of synchronization with the ascending of the mounter lever A, the proceeding time $\Delta t_b$ of the blade 21 can be elongated, so that the frictional force between the chip components P and the blade 21 is sufficiently exerted, and the chip components P can be thereby fed in a stable state.

FIGS. 12 to 15 show a feeder for chip components according to a third embodiment of the present invention. In this embodiment, the blade 21 is used for the conveying member just like in the second embodiment; however, a cam mechanism is employed for reciprocating the blade 21. The feed lever 1 is guided movably in the vertical direction by a guide portion 29 disposed in the feeder body.

In addition, like reference characters designate like portions having functions common to those in FIG. 7, and description thereof is omitted.

Figure 12:
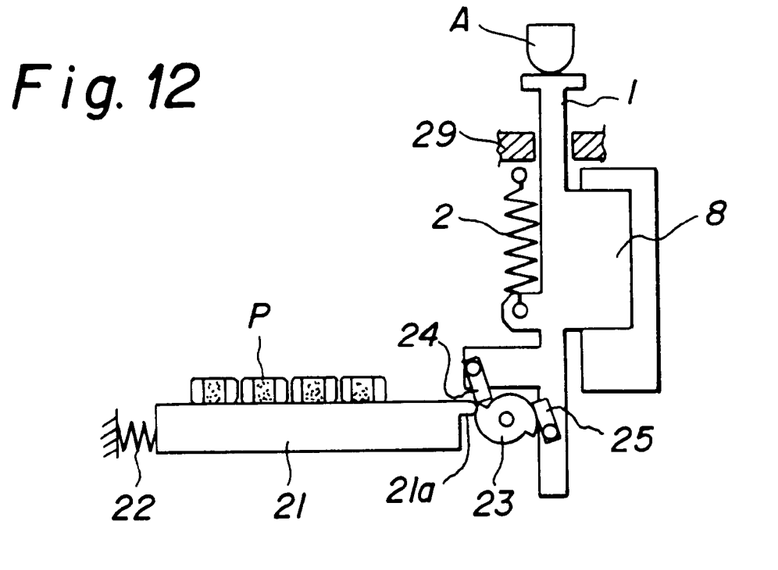
FIG. 12 is a side view of a feeder according to a third embodiment of the present invention.

The blade 21 is normally urged rearward by a spring 22, and a projection 21a disposed at the rear end of the blade 21 is thereby brought into contact with the peripheral surface of a cam 23. A ratchet gear (not shown) is coaxially connected with the cam 23, and a pair of feed claws 24 and 25 disposed in the lower end portion of the feed lever 1 mesh with the ratchet gear so as to rotate the cam 23 intermittently only counterclockwise.

The operation of the feeder will be described with reference to FIGS. 12 to 15.

FIG. 12 shows the state that the mounter lever A is at the top dead center, and the feed lever 1 is also at the upper-end position being in contact with the mounter lever A. The projection 21a at the rear end of the blade 21 is in contact with the peak portion of the cam 23 and the blade 21 is at the front-end position.

Figure 13:
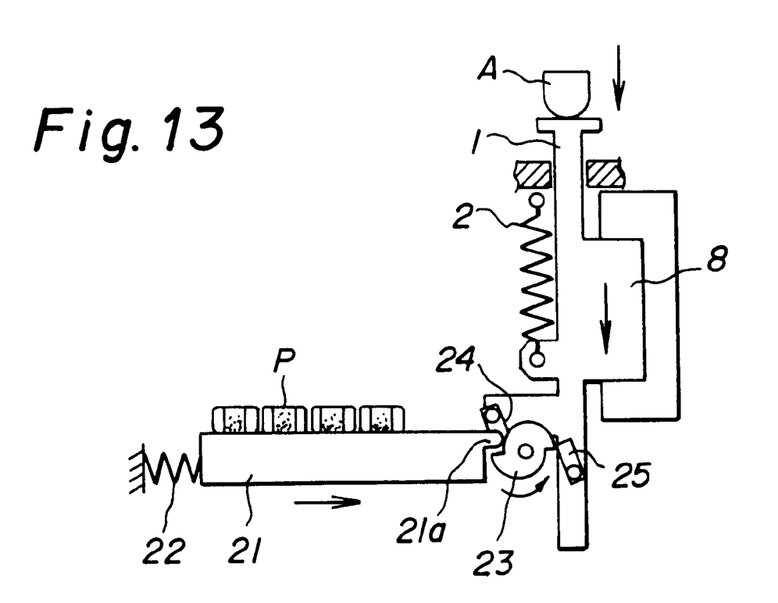
FIG. 13 is a side view of the feeder shown in FIG. 12 when it is descending.

FIG. 13 shows the state that the mounter lever A is descending, and the feed lever 1 also descends in synchronization with the mounter lever A. At this time, the spring 2 is deformed under tension and stores the input energy of the mounter lever A as elastic energy. Simultaneously, the feed claw 24 in the front side rotates the cam 23 (ratchet gear) counterclockwise, so that the projection 21a at the rear end of the blade 21 is dropped into the valley portion of the cam 23, and the blade 21 is thereby retracted at a high speed. Therefore, slippage between the blade 21 and the chip components P occurs, so that only the blade 21 is retracted while the chip components P maintain their positions.

Figure 14:
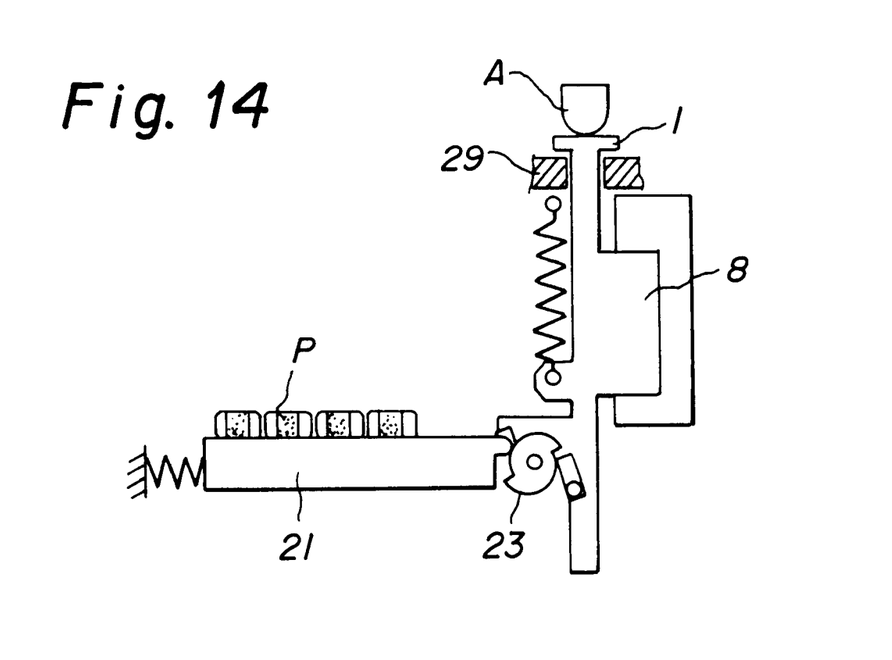
FIG. 14 is a side view of the feeder shown in FIG. 12 when it is at the bottom dead center.

FIG. 14 shows the state that the mounter lever A stops at the bottom dead center. At this time, the blade 21 is at the rear-end position, and the-chip components P are placed in the vicinity of the front-end position of the blade 21.

Figure 15:
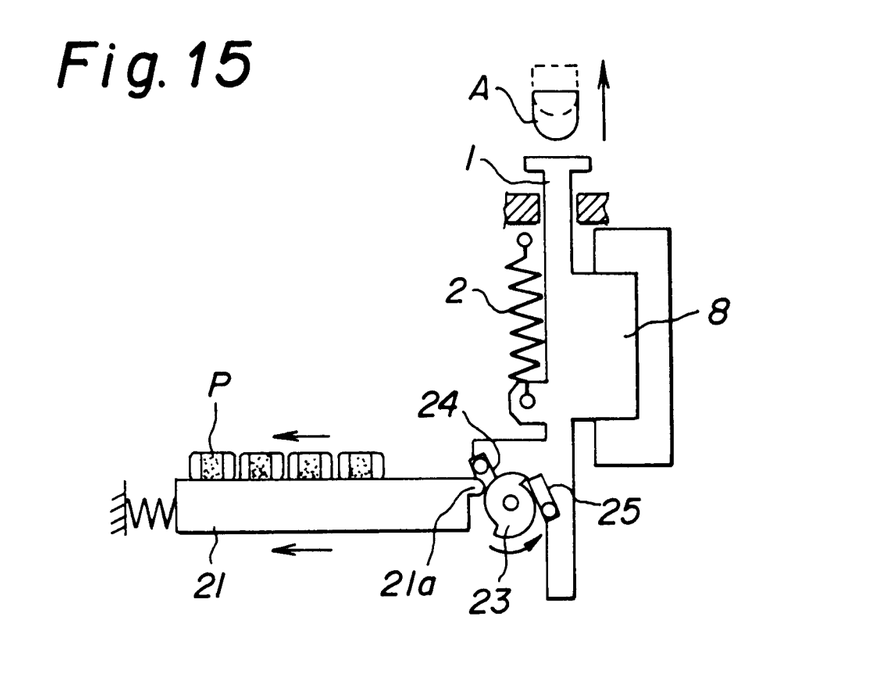
FIG. 15 is a side view of the feeder shown in FIG. 12 when it is ascending.

When the mounter lever A starts to ascend, as shown in FIG. 15, the feed lever 1 ascends by the elastic energy stored in the spring 2. When the feed lever 1 ascends, the feed claw 25 in the rear side rotates the cam 23 (ratchet gear) counterclockwise, so that the projection 21a at the rear end of the blade 21 rides onto the peak portion from the valley portion of the cam 23, and thereby the blade 21 proceeds at a low speed. At this time, due to the function of the delay mechanism (eddy current damper 8), the ascending speed of the feed lever 1 is restrained to be low, so that the rotating speed of the cam is to be low, and also the proceeding speed of the blade 21 is thereby restrained to be low. That is, due to the frictional force of the blade 21, the entire chip components P are forwardly moved by one increment by the forward proceeding of the blade 21 at a low speed.

Figure 16A:
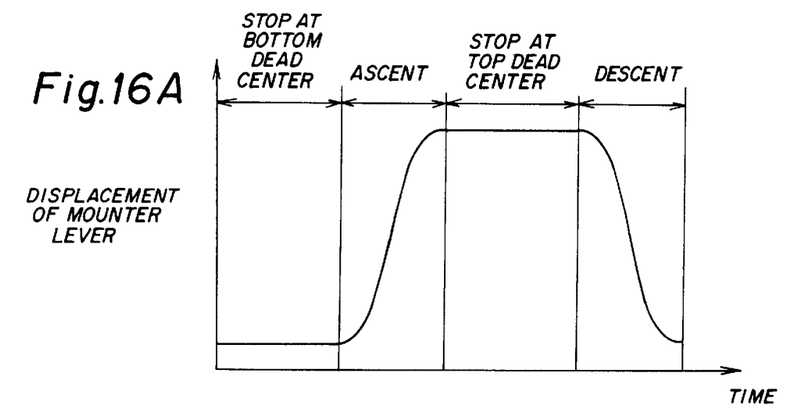
FIGS. 16A to 16C are time charts for comparing operation of a feeder without a delay mechanism with that of a feeder having a delay mechanism shown in FIG. 12.
Figure 16B:
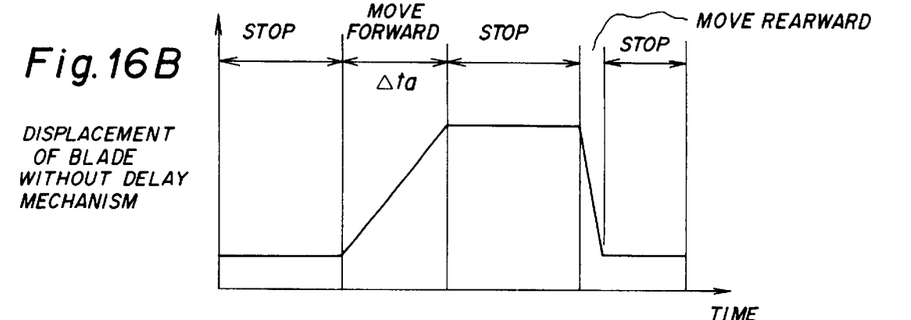
Figure 16C:
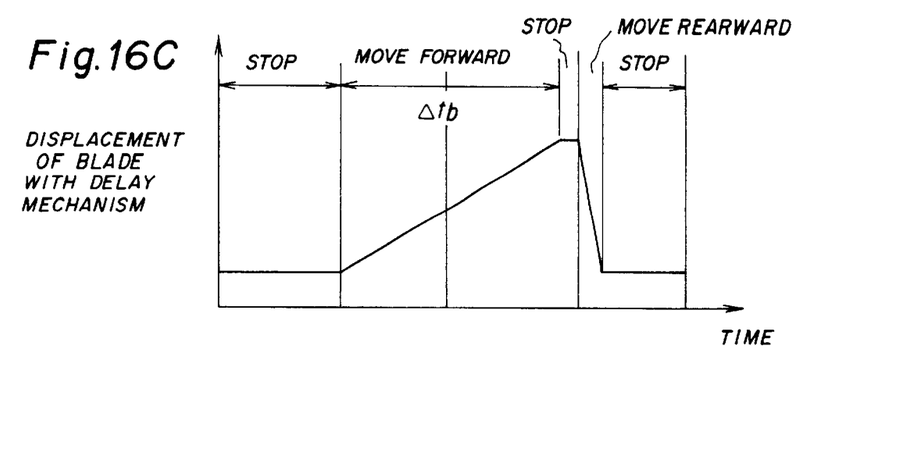

FIGS. 16A to 16C show operations of the mounter lever A and the blade 21 of the feeder shown in FIG. 12. In addition, FIG. 16B shows the operation of the blade 21 without the delay mechanism (eddy current damper 8).

When the blade 21 has not the delay mechanism, as shown in FIG. 16B, since the blade 21 proceeds in synchronization with the ascending of the mounter lever A, the proceeding time $\Delta t_a$ of the blade 21 is small. In contrast, when the delay mechanism 8 is provided, as shown in FIG. 16C, since the blade 21 proceeds out of synchronization with the ascending of the mounter lever A, the proceeding time $\Delta t_b$ of the blade 21 can be prolonged, so that the frictional force between the chip components P and the blade 21 is sufficiently exerted. In addition, during the retraction, in both cases shown in FIGS. 16B and 16C, the blade 21 is retracted at a high speed because the projection 21a at the rear end of the blade 21 is dropped into the valley portion of the cam 23.

In this embodiment, by the synergistic effect of the cam profile of the cam 23 and the delay mechanism 8, the proceeding speed of the blade 21 is further reduced, so that the frictional force between the chip components P and the blade 21 can be effectively exerted furthermore. The retracting speed of the blade 21 is determined by the dropping into the valley portion from the peak portion of the cam 23 without depending on the speed of the mounter lever A, so that the retracting speed can be increased, and the chip components P can be thereby slid securely relative to the blade 21 during the retraction. Therefore, the extremely stable feeding can be achieved.

Figure 17:
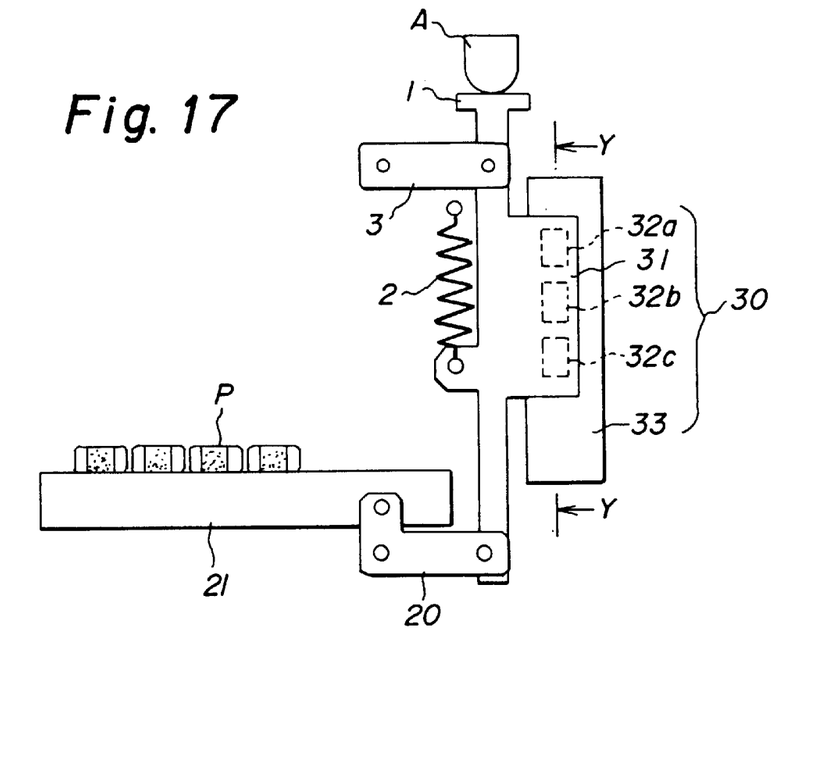
FIG. 17 is a side view of a feeder according to a fourth embodiment of the present invention.
Figure 18:
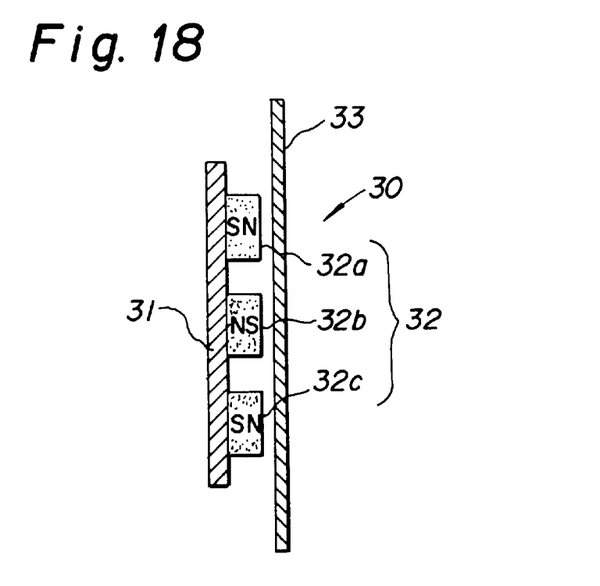
FIG. 18 is a cross-sectional view at the line Y-Y of FIG. 17.

FIGS. 17 and 18 show a feeder for chip components according to a fourth embodiment of the present invention. In this embodiment, the blade 21 is used for the conveying member just like in the second embodiment (see FIG. 7), while a hysteresis brake 30 is employed as a delay mechanism. In addition, like reference characters designate like portions having functions common to those in FIG. 7, and description thereof is omitted.

The hysteresis brake 30 comprises a yoke 31 having composite magnetic poles 32 and a soft magnetic material 33 arranged so as to oppose the composite magnetic poles 32. The yoke 31 is unitarily arranged with the feed lever 1 while the soft magnetic material 33 is fixed to the feeder body, for example. As shown in FIG. 18, in the composite magnetic poles 32, plural magnets 32a to 32c are arranged so that the N pole of the magnet and the S pole are alternately arrayed. The soft magnetic material 33 is arranged so as to oppose the composite magnetic poles 32 and to be relatively movable in the direction orthogonal to the opposing direction.

In addition, in the composite magnetic poles 32, plural poles may be alternately arrayed in one magnet instead of forming the composite magnetic poles 32 by plural magnets.

The operational fundamentals of the hysteresis brake 30 will be described with reference to FIG. 19.

Figure 19A:
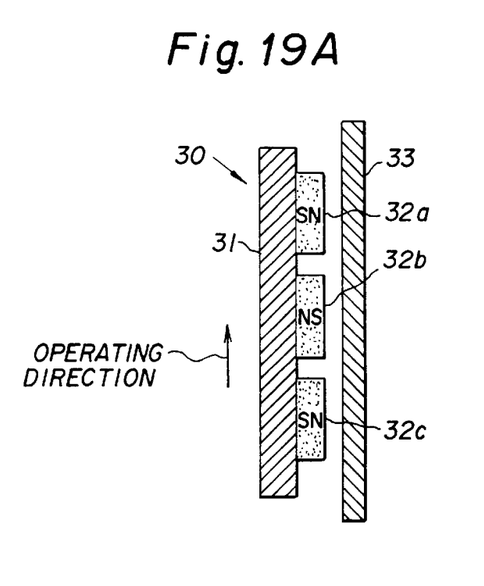
FIGS. 19A to 19D are diagrams for showing operational fundamentals of a hysteresis brake.
Figure 19B:
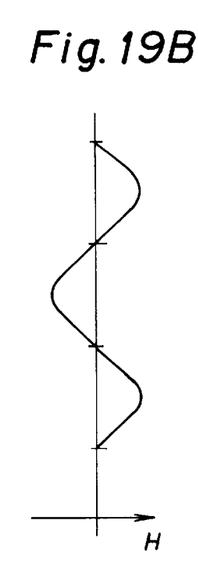
Figure 19C:
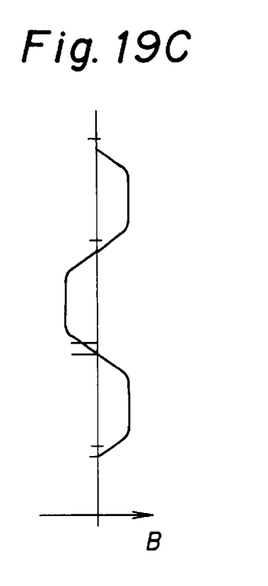
Figure 19D:
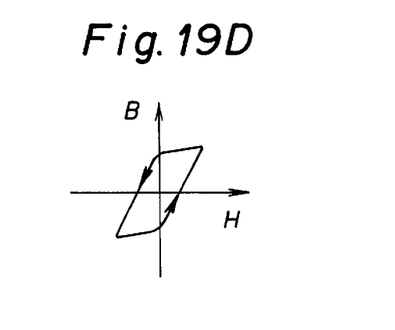

When a magnetomotive force H by the magnets 32a to 32c exhibits a sine wave as shown in FIG. 19B, a magnetic flux density B of the magnetic material 33 magnetized accompanied by the magnetomotive force is shown as in FIG. 19C. The phase lag θ between the magnetomotive force H and the magnetic flux density B is caused by a hysteresis curve (B-H curve) of the magnetic material 33 shown in FIG. 19D. That is, since the B-H curve has hysteresis characteristics, the wave form of the magnetic flux density B of the magnetic material 33 magnetized by the magnetomotive force is distorted so as to diverge from a sine wave relative to the magnetomotive force H of the composite magnetic poles 32 distributed with a sine wave in space, and deviates by θ from the magnetomotive force H. When using Fleming's left-hand rule, a force T is obtained by the following relation:

$$T = k \cdot H \cdot B \cdot \sin \theta \text{ (wherein k=constant)}$$

Accordingly, when the magnetic material 33 having a large hysteresis loss is used, the phase lag θ is increased and the brake force T is thereby increased.

The hysteresis brake 30 has characteristics that the generated brake force is not dependent on the speed, so that the brake force even at a low speed can be easily obtained. Therefore, when the hysteresis brake 30 is arranged between the feed lever 1 and the feeder body, even when the feed lever 1 is moved at a low speed, the sufficient brake force can be obtained, so that delay operation can be securely achieved. That is, when the feed lever 1 ascends by the elastic energy (spring force) stored in the spring 2, the ascending speed of the feed lever 1 is restrained to be low by the function of the hysteresis brake 30, so that the proceeding speed of the blade 21 is also reduced. Consequently, by the proceeding of the blade 21 at a low speed, the entire chip components P can be securely moved forwardly by one increment due to the frictional force of the blade 21.

In the fourth embodiment, as the magnetic material 33 forming the hysteresis brake 30, a material having conductivity may be used or a magnetic material having a conductive material bonded thereon may be employed.

In the latter case, the hysteresis brake 30 can serve the function of the eddy current damper as well. That is, a large brake force can be obtained by the effect of the hysteresis brake in operation even at a low speed while when the speed of the feed lever 1 is to be high, the effect as the eddy current damper is increased so that a larger brake force is exerted. Thereby, excessive acceleration of the feed lever 1 is restrained so that the conveying of the chip components can be securely achieved.

The reciprocating conveying member is not limited to the blade, and any member can be employed as long as it can form a bottom portion of a guide passage for the chip components and is movable back and forth as well. However, when a thin member such as the blade is used, weight saving can be achieved resulting in reducing the inertia effect during the reciprocating.

According to the present invention, the operating direction of the chip mounter (mounter lever A) is not limited to be vertical; it may be horizontal or oblique and the operating direction can be arbitrarily selected.

Similarly, the operating direction of the feed lever is not limited to be vertical; it may be horizontal or oblique. Furthermore, the operating of the feed lever is not limited to linear movement; it may be swinging about an axis of rotation.

In the fourth embodiment, the hysteresis brake 30 is applied as a delay mechanism to the feeder with the blade 21; however, it may be certainly applied to the feeder with the belt 12 shown in FIG. 2.

In the above-mentioned embodiments, the delay mechanism such as the eddy current damper 8 or the hysteresis brake 30 is arranged between the feed lever 1 and the feeder body (fixed portion); it is not limited to the arrangement. For example, it may be arranged between the feed lever and a different member as long as the different member does not move at least during the retraction of the feed lever.

Also, instead of the feed lever, the delay mechanism may be arranged between the blade and the feeder body.

As understood by the above description, in a feeder according to a first aspect of the present invention, due to the delay mechanism, the conveyor belt is out of synchronization with the retracting movement of the chip mounter and continues to move at a low speed-after the chip mounter is stopped. Thereby, the belt can be driven for a long time at a low speed and the frictional force between the belt and the chip components can be effectively exerted, so that the chip components can be fed in a stable state even in high-speed operation.

In a feeder according to a second aspect of the present invention, the chip components are supplied in one direction by the difference of the respective frictional forces between the feeding (forward movement) and the retracting (rearward movement) of the conveying member due to the speed difference thereof. The feed lever is retracted behind the chip mounter due to the delay mechanism, and accordingly, the conveying member also proceeds forwardly at a low speed behind the chip mounter, so that a frictional force can be effectively exerted to the chip components placed on the conveying member. Therefore, the chip components can be supplied with high stability even in high-speed operation.

What is claimed is:

1. A feeder for chip components, including a feed lever operated according to the input load from a chip mounter and a conveyor belt connected to the feed lever via a one-way feeding mechanism, the feeder feeding chip components on the conveyor belt in one direction by intermittently driving the conveyor belt in one direction, the feeder for chip components comprising:

an urging means for urging the feed lever in the returning direction by storing the input load of the chip mounter in the operating direction as energy; and a delay mechanism for delaying the returning operation of the feed lever relative to the operation of the chip mounter in the returning direction, wherein when the chip mounter operates in the operating direction, the feed lever is moved in the operating direction by linking to the chip mounter while the conveyor belt is maintained in a stationary state by the one-way feeding mechanism, and wherein when the chip mounter operates in the returning direction, the feed lever is moved in the returning direction so as to be delayed relative to the chip mounter by the urging means and the delay mechanism while the conveyor belt is driven via the one-way feeding mechanism, and wherein operation directions of the urging means and the delay mechanisms are in parallel.

2. A feeder according to claim 1, wherein the delay mechanism is an eddy current damper.

3. A feeder according to claim 1, wherein the delay mechanism is a hysteresis brake.

4. A feeder according to claim 3, wherein the hysteresis brake adds a function as an eddy current damper by forming the entirety of or part of the magnetic material forming the hysteresis brake from a conductive material.

5. A feeder for chip components, including a feed lever operated according to the input load from a chip mounter and a conveying member connected to the feed lever via a transmission mechanism, the feeder feeding chip components on the conveying member in one direction by reciprocating the conveying member using a frictional force, the feeder for chip components comprising:

an urging means for urging the feed lever in the returning direction by storing-the input load of the chip mounter in the operating direction as energy; and a delay mechanism for delaying the returning operation of the feed lever relative to the operation of the chip mounter in the returning direction, wherein when the chip mounter operates in the operating direction, the feed lever is moved in the operating direction by linking to the chip mounter while the chip components are slid relative to the conveying member by retracting the conveying member at high speed via the transmission mechanism, and wherein when the chip mounter operates in the returning direction, the feed lever is moved in the returning direction so as to be delayed relative to the chip mounter by the delay mechanism while the chip components are unitarily conveyed with the conveying member by forwardly driving the conveying member at low speed via the transmission mechanism.

6. A feeder according to claim 5, wherein the delay mechanism is an eddy current damper.

7. A feeder according to claim 5, wherein the delay mechanism is a hysteresis brake.

8. A feeder according to claim 5, wherein the transmission mechanism comprises a cam intermittently rotating in one direction according to the movement of the feed lever and a spring for making the conveying member contact with and to track the surface of the cam.

9. A feeder according to claim 8, wherein the delay mechanism is an eddy current damper.

10. A feeder according to claim 8, wherein the delay mechanism is a hysteresis brake.

11. A feeder according to claim 5, wherein the transmission mechanism comprises a bell crank wherein the feed lever and the conveying member are rotatably connected to arm portions projectingly formed on both sides of a swinging shaft.

12. A feeder according to claim 11, wherein the delay mechanism is an eddy current damper.

13. A feeder according to claim 11, wherein the delay mechanism is a hysteresis brake.

* * * * *